United States Patent [19]

Ootani et al.

[11] Patent Number: 4,931,998

[45] Date of Patent: Jun. 5, 1990

[54] SEMICONDUCTOR MEMORY DEVICE WHICH CAN SUPPRESS OPERATION ERROR DUE TO POWER SUPPLY NOISE

[75] Inventors: Takayuki Ootani; Masataka Matsui, both of Tokyo, Japan

[73] Assignee: Kabushiki Kaisha Toshiba, Kawasaki, Japan

[21] Appl. No.: 310,438

[22] Filed: Feb. 15, 1989

[30] Foreign Application Priority Data

Feb. 18, 1988 [JP] Japan .................................. 63-35614

[51] Int. Cl.$^5$ .............................................. G11C 11/40
[52] U.S. Cl. ........................... 365/230.01; 365/189.01; 365/189.04; 365/230.06
[58] Field of Search ........... 365/189.01, 230.1, 189.04, 365/230.06

[56] References Cited

U.S. PATENT DOCUMENTS 4,648,076 3/1987 Schrenk .......................... 365/189.01

Primary Examiner—Terrell W. Fears
Attorney, Agent, or Firm—Finnegan, Henderson, Farabow, Garrett and Dunner

[57] ABSTRACT

A row address signal is supplied to a row address input buffer, and a column address signal is supplied to a column address input buffer. The row address signal supplied to the row address input buffer is then supplied to a row main decoder, through a row address predecoder, the column address signal supplied to the column address input buffer being supplied to a column address predecoder. An output from the column address predecoder is supplied to a filter or delay circuit, and an output signal from the filter or delay circuit is supplied to a column main decoder. One memory cell in a memory cell array is selected in response to decode outputs from the row main decoder and the column main decoder, and readout data of the selected memory cell is amplified by a sense amplifier. An output from the sense amplifier is output through a data output circuit and a data output buffer. An erroneous detected signal of the column address buffer, arising from power supply noise generated when an output from the data output buffer is inverted, is eliminated or reduced by the filter or delay circuit.

19 Claims, 4 Drawing Sheets

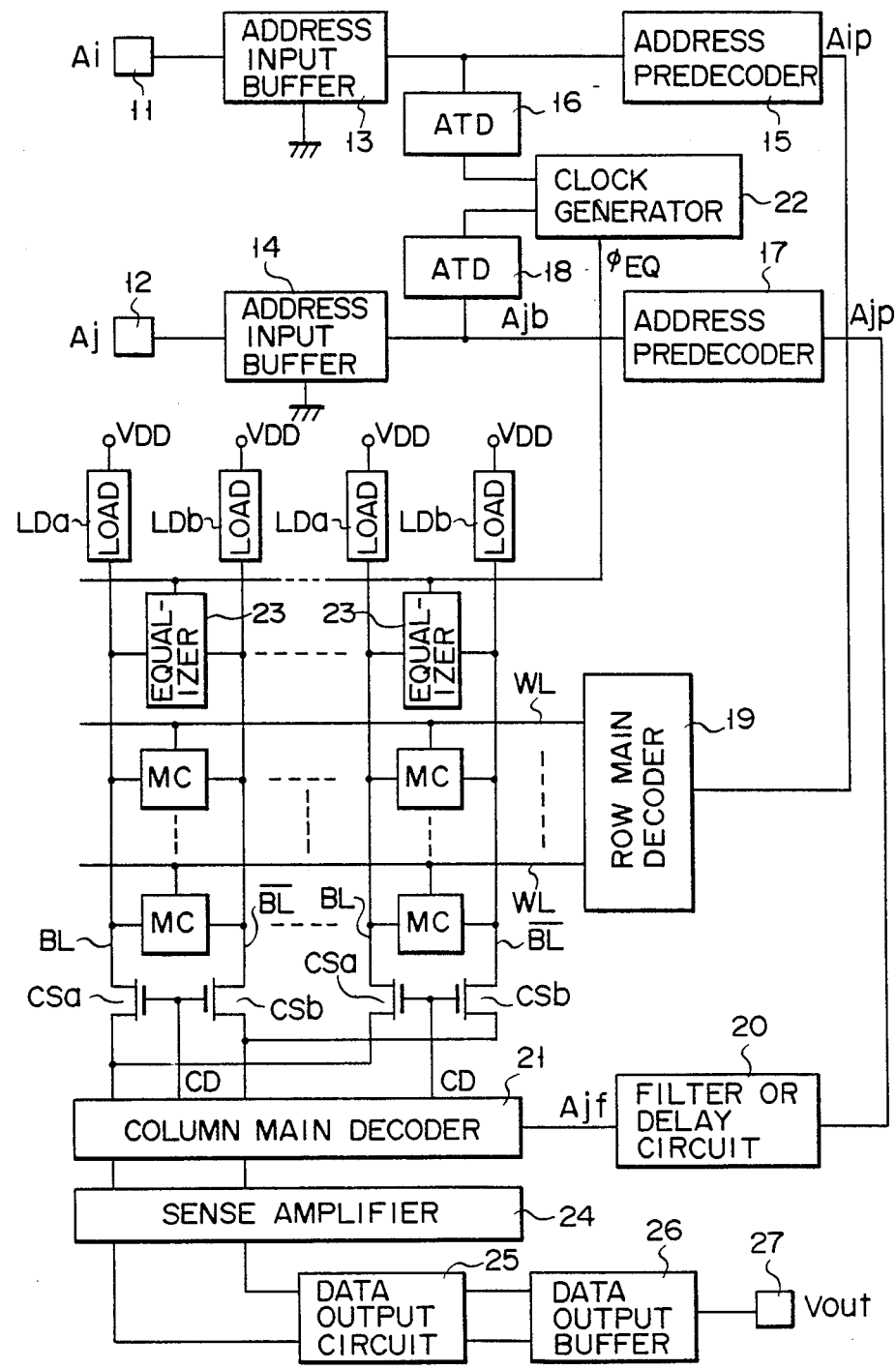
F I G. 1

FIG. 2(a) Ai
FIG. 2(b) Aj
FIG. 2(c) Vss
FIG. 2(d) Aip
FIG. 2(e) Ajb
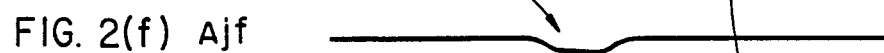
FIG. 2(f) Ajf
FIG. 2(g) $\phi_{EQ}$
FIG. 2(h) WL
FIG. 2(i) CD
FIG. 2(j) Vout FIG. 4(a) Ajp
FIG. 4(b) Ajd
FIG. 4(c) Ajf FIG. 6(a) Ajp
FIG. 6(b) Ajd
FIG. 6(c) Ajf

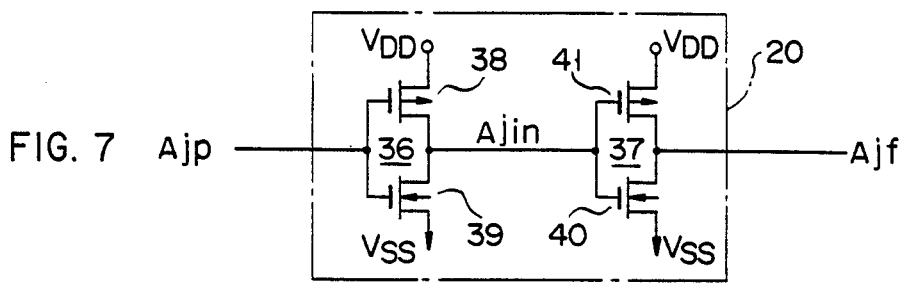
FIG. 7
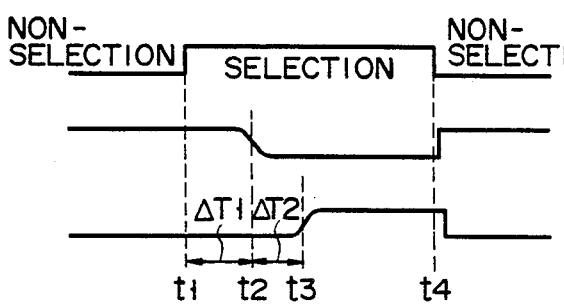
FIG. 8(a) Ajp
FIG. 8(b) Ajin
FIG. 8(c) Ajf
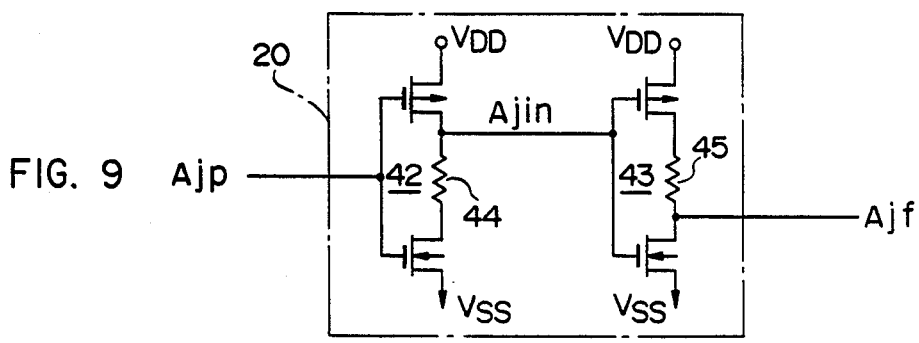
FIG. 9
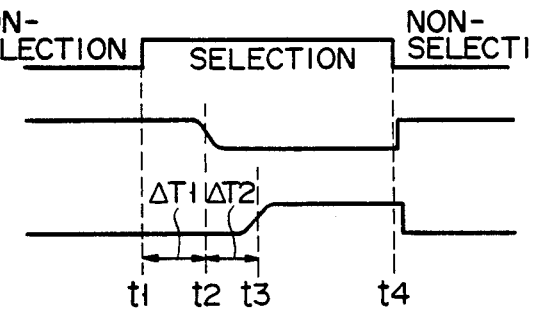
FIG. 10(a) Ajp
FIG. 10(b) Ajin
FIG. 10(c) Ajf

SEMICONDUCTOR MEMORY DEVICE WHICH CAN SUPPRESS OPERATION ERROR DUE TO POWER SUPPLY NOISE

BACKGROUND OF THE INVENTION

1. Field of the Invention

The present invention relates to a semiconductor memory device which can suppress an operation error arising from power supply noise and, more particularly, to a semiconductor memory device which incorporates an address transition detector (ATD) and hence realizes a high-speed operation.

2. Description of the Related Art

An ATD is incorporated in a memory device in order to realize high-speed reading of memory data of a semiconductor memory device. The ATD detects a change in address signal and generates a clock pulse. The clock pulse generated from the ATD is used for equalizing control of bit and sense amplifier lines, and the like, so that a high-speed reading operation can be realized. More specifically, before an address is selected in accordance with the change in address signal, the potentials of a pair of bit lines and a pair of sense amplifier lines arranged at an output terminal of a sense amplifier are equalized on the basis of the control, in response to a clock pulse generated from the ATD. Therefore, the influence of a data output during a prior cycle is erased in a short period of time.

The ATD is described in, for example, 1987 IEEE International Solid-State Circuits Conference DIGEST OF TECHNICAL PAPERS pp. 264, 265 and 420 "A 25ns·1Mb CMOS SRAM" T.Ohtani et. al., 1985 IEEE International Solid-State Circuits Conference DIGEST OF TECHNICAL PAPERS pp. 64, 65 and 306 "A 17ns 64K CMOS RAM with a Schmitt Trigger Sense Amplifier" Kiyofumi Ochii et. al., 1984 IEEE International Solid-State Circuits Conference DIGEST OF TECHNICAL PAPERS pp. 216, 217 and 341 "A 30ns 64K CMOS RAM" Kim Hardee et. al., and the like.

In a memory device having a memory designed for high-speed operation, in particular, a memory device having a large number of data bits, i.e., one having an output configuration of 8-bits or more, power supply noise is generated due to a large peak current when a data output buffer is driven, and internal circuits are erroneously operated. The operation error is exemplified by a detection error of an input signal level caused by power supply noise. When a power supply potential is varied due to a large driving current during an operation of the output buffer, the detection error is caused. The change in power supply potential is conducted to an address input buffer by distributed parasitic inductance and distributed parasitic resistance in a power supply line. Therefore, the detection level of the address input buffer is changed, and hence an erroneous address input signal is supplied to a decoder. For this reason, the memory cell at an erroneous address is selected, and memory data of the memory cell is output. If the power supply noise is significantly increased and the above phenomena are repeated, a chip mounting the memory devices is often set in the oscillation state.

SUMMARY OF THE INVENTION

It is therefore an object of the present invention to provide a semiconductor memory device which can suppress an operation error arising from power supply noise, without an increase in the read access time.

According to an embodiment of the present invention, there is provided a semiconductor memory device comprising a memory cell array in which memory cells are arranged in a matrix form, a first address input circuit for receiving a row address signal, a second address input circuit for receiving a column address signal, a first decoder for decoding an output signal from the first address input circuit, thereby to select a row of the memory cell array, a filter or delay circuit for receiving an output signal from the second address input circuit and eliminating a level change of the output signal during a predetermined period of time, a second decoder for decoding an output from the filter or delay circuit, to select a column of the memory cell array, a sense amplifier for amplifying data stored in the memory cell selected in response to outputs from the first and second decoders, and an output circuit for outputting a signal from the sense amplifier.

With this arrangement, even if the second address input circuit erroneously detects an address signal due to power supply noise, an operation error by the second decoder is controlled, since noise components included in a column address signal output from the address input circuit. Since the operation speed required for determination of the column address is lower than that for the row address, therefore when the time, by which the column address signal has been delayed by the filter or delay circuit, is set within a time period until the row address is determined, after the column address has been determined, the operation speed is unaffected.

As a result, there is herewith provided a semiconductor memory device which can suppress an operation error arising from power supply noise, without an increase in the read access time.

BRIEF DESCRIPTION OF THE DRAWINGS

FIG. 1 is a block diagram showing an arrangement of a semiconductor memory device according to a first embodiment of the present invention;

FIG. 2(a)–2(j) is a timing chart showing signal waveforms of parts included in the circuit shown in FIG. 1;

FIG. 4(a)–4(c) is a timing chart showing signal waveforms of parts included in the filter shown in FIG. 3;

FIG. 6(a)–6(c) is a timing chart showing signal waveforms of parts included in the filter shown in FIG. 5;

FIG. 7 is a circuit diagram showing an arrangement of a delay circuit included in the circuit shown in FIG. 1;

FIG. 8(a)–8(c) is a timing chart showing signal waveforms of parts included in the delay circuit shown in FIG. 7;

FIG. 9 is a circuit diagram showing another arrangement of the delay circuit included in the circuit shown in FIG. 1;

FIG. 10(a)–10(c) is a timing chart showing signal waveforms of parts included in the delay circuit shown in FIG. 9; and FIG. 11 is a block diagram showing an arrangement of a semiconductor memory device according to a second embodiment of the present invention.

DETAILED DESCRIPTION OF THE PREFERRED EMBODIMENTS

Figure 3:
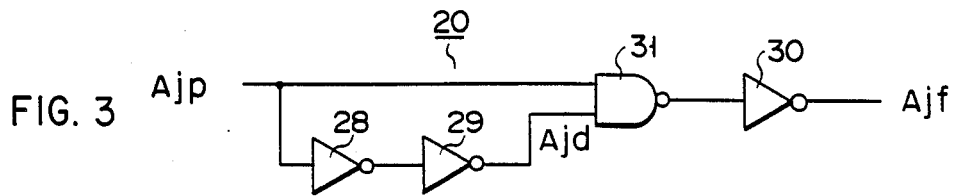
FIG. 3 is a circuit diagram showing an arrangement of a filter included in the circuit shown in FIG. 1.

FIG. 1 shows a semiconductor memory device according to a first embodiment of the present invention. Row address signal Ai is supplied to address input terminal 11, and column address signal Aj is supplied to address input terminal 12. The input terminals of address input buffers 13 and 14 are connected to address input terminals 11 and 12, respectively. The input terminals of address predecoder 15 and address transition detector (ATD) 16 are connected to the output terminal of address input buffer 13, and the input terminals of address predecoder 17 and ATD 18 are connected to the output terminal of address input buffer 14. The input terminal of row main decoder 19 is connected to the output terminal of address predecoder 15, the input terminal of filter or delay circuit 20 is connected to the output terminal of address predecoder 17, and the input terminal of column main decoder 21 is connected to the output terminal of filter or delay circuit 20. The delay time of a column address signal delayed by filter or delay circuit 20 is set within a delay time from the input of a row address signal to the determination of a row address of memory cell MC in response to an output of row main decoder 19. The input terminals of clock generator 22 are connected to the output terminals of ATDs 16 and 18, and one end of each word line WL is connected to a corresponding output terminal of row main decoder 19. Each gate of a pair of column selection MOS transistors CSa and CSb is connected to a corresponding decode signal CD output terminal of column main decoder 21. One end of each of the current paths of each pair of column selection MOS transistors CSa and CSb are connected to sense amplifier 24, and the other ends thereof are respectively connected to one ends of the corresponding pair of bit lines BL and $\overline{BL}$. Word lines WL and bit lines BL and $\overline{BL}$ intersect with each other and memory cells MC are arranged at each intersection position in a matrix form. Bit line loads LDa and LDb are connected between the other ends of corresponding bit lines BL and $\overline{BL}$ and power supply VDD, respectively. Bit line equalizers 23 are arranged between bit lines BL and $\overline{BL}$ and bit line loads LDa and LDb, respectively, each bit line equalizer 23 consisting of, for example, a MOS transistor in which a current path is connected between bit lines BL and $\overline{BL}$. The output terminal of clock generator 22 is connected to the gates of the MOS transistors, the input terminals of data output circuit 25 are connected to the output terminals of sense amplifier 24, the input terminals of data output buffer 26 are connected to the output terminals of data output circuit 25, and output terminal 27 is connected to the output terminal of data output buffer 26.

A normal reading operation performed by the device having the above arrangement will now be described. Row and column address signals Ai and Aj are supplied to address input buffers 13 and 14 through address input terminals 11 and 12. When row and column address signals Ai and Aj are supplied to address input buffers 13 and 14, the change in address signals is detected by ATDs 16 and 18, as a result of which, clock pulse $\phi_{EQ}$ for equalizing each pair of bit lines BL and $\overline{BL}$ is output from clock generator 22. Since bit line equalizer 23 is rendered active only during a predetermined period of time in which clock pulse $\phi_{EQ}$ is at level "H", therefore short-circuiting occurs between bit lines BL and $\overline{BL}$, and the output level of the prior cycle is equalized, causing the potentials of bit lines BL and $\overline{BL}$ to become equal. When clock pulse $\phi_{EQ}$ goes to level "L", bit line equalizer 23 is disabled and the pair of bit lines BL and $\overline{BL}$ is precharged by bit line loads LDa and LDb.

Row address signal Ai, supplied to address input buffer 13, is subsequently supplied to row main decoder 19 through address predecoder 15, in parallel with the above equalizing operation, while column address signal Aj, supplied to address input buffer 14, is subsequently supplied to column main decoder 21 through address predecoder 17 and filter or delay circuit 20. When member 20 denotes a filter (member 20 can be either a filter or a delay circuit), signal noise arising from the detection error of column address signal Aj, caused by power supply noise included in column address signal Aj output from address predecoder 17 (caused during the prior reading cycle), is absorbed or reduced. On the other hand, when member 20 is constituted by a delay circuit, the leading or trailing edge of the signal noise is delayed, so that the signal level is gradually changed. In this way, an erroneously detected signal arising from power supply noise is not supplied to column main decoder 21. In a standard semiconductor memory device, the operation speed of column selection is higher than that of row selection, and this also applies to the memory device shown in FIG. 1. Therefore, by arranging filter or delay circuit 20, if column address signal Aj is delayed until a row address is determined, the access time is not delayed.

Then, the row of memory cells connected to one word line WL selected by row main decoder 19 is selected, in addition to the pair of bit lines BL and $\overline{BL}$ in one column selected by column decode signal CD output from column main decoder 21. At this time, bit line equalizer 23 is already disabled. Therefore, one memory cell MC positioned at the intersecting point between selected row word line WL and bit lines BL and $\overline{BL}$ is selected. The memory data of selected memory cell MC is supplied to sense amplifier 24 and then amplified. An output from sense amplifier 24 is supplied to data output buffer 26 through data output circuit 25, and is output from output terminal 27 as output data Vout.

An operation when power supply noise is generated will be described in detail hereinafter, with reference to the timing chart shown in FIG. 2(a)–2(j). FIG. 2(a)–2(j) shows the case wherein row address signal Ai changes from level "L" ($V_{IL}$) to level "H" ($V_{IH}$), and column address signal Aj is kept at level "H". Assume that an output during the prior cycle of data output buffer 26 is inverted (from level "H" to level "L") when the address is changed. At this time, the potential of power supply $V_{SS}$ is increased due to power supply noise. Therefore, when address input buffer 14 is erroneously operated, column address signal Ajb to be at level "H" output from buffer 14 is set at level "L" for a short period of time. However, since output Ajp from address predecoder 17 becomes signal Ajf in which noise is eliminated or the trailing edge is delayed, the influence of the power supply noise is not conducted to column main decoder 21.

Note that address input buffer 13 is affected by the power supply noise in the same manner as in address input buffer 14. However, since an operation speed of row address selection is lower than that of column address selection, an operation error when the row is selected by row main decoder 19 is negligible.

When row and column address signals Ai and Aj are respectively supplied to address input buffers 13 and 14, the changes in address signals are detected by ATDs 16 and 18. The detection signals are supplied to clock generator 22, and clock pulse $\phi_{EQ}$ for equalizing each pair of bit lines BL and $\overline{BL}$ is output from clock generator 22 for a predetermined period. Therefore, bit line equalizer 23 is enabled and bit lines BL and $\overline{BL}$ are short-circuited, thus equalizing the level of the prior cycle.

Thereafter, one memory cell MC is selected in response to outputs from row and column main decoders 19 and 21. Memory data of selected memory cell MC is output through sense amplifier 24, data output circuit 25, data output buffer 26, and output terminal 27. When this data is output, the level of power supply $V_{SS}$ is increased by a driving current flowing in data output buffer 26. Therefore, address input buffers 13 and 14 may be affected by power supply noise. However, since the above-mentioned operation are repeated, the operation error due to the power supply noise is suppressed.

With the above arrangement, an output error when address input buffer 14 is erroneously operated by filter or delay circuit 20 can be eliminated or reduced. In addition, since a signal delay time of filter or delay circuit 20 is set shorter than a time period required until a row address is determined after row address signal Ai is changed, access time is not reduced. Therefore, a detection error of the level of column address signal Aj due to a large peak current generated when data output buffer 26 is driven can be reduced without loss of read access time.

FIG. 3 shows an arrangement of filter 20 in the circuit shown in FIG. 1. This filter 20 consists of three inverters 28 to 30 and one NAND gate 31. Output signal Ajp from address predecoder 17 is supplied to one input terminal of NAND gate 31 and the input terminal of inverter 28. An output from inverter 28 is supplied to inverter 29. Output Ajd from inverter 29 is supplied to the other input terminal of NAND gate 31. An output from NAND gate 31 is supplied to inverter 30. Output Ajf from inverter 30 is supplied to column main decoder 21 as an output from filter 20.

FIG. 4(a)–4(c) is a waveform chart of the signals of filter 20 shown in FIG. 3. When output signal Ajp from address predecoder 17 goes to level "H" (time t1), output Ajd from inverter 29 is set at level "H" after delay time $\Delta T$ by inverters 28 and 29 has elapsed (time t2). Therefore, an output from NAND gate 31 is set at level "L", and output Ajf from inverter 30 is set at "H". At this time, column main decoder 21 performs a selecting operation. Therefore, even if power supply noise is superposed on column address signal Aj during period $\Delta T$ between times t1 and t2, this noise is not conducted to column main decoder 21. Therefore, the influence of the power supply noise is eliminated. When output Ajp from address predecoder 17 is set at level "L" (nonselection state) (time t3), signal Ajf is also set at level "L".

Note that although two inverters 28 and 29 are arranged at the other input terminal of NAND gate 31 in the circuit shown in FIG. 3, four or more even-numbered inverters may be arranged so as to obtain a required delay time.

Figure 5:
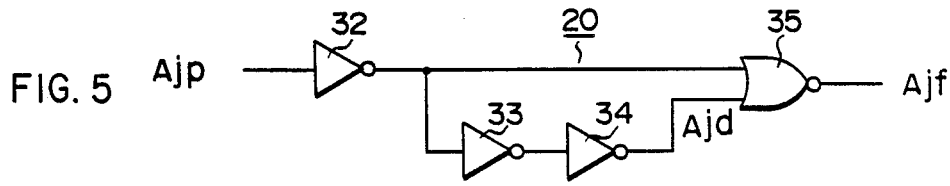
FIG. 5 is a circuit diagram showing another arrangement of the filter included in the circuit shown in FIG. 1.

FIG. 5 shows another arrangement of filter 20. This filter 20 consists of three inverters 32 to 34 and one NOR gate 35. Output signal Ajp from address predecoder 17 is supplied to the input terminal of inverter 32. An output from inverter 32 is supplied to one input terminal of NOR gate 35 and the input terminal of inverter 33. Output from inverter 33 is supplied to inverter 34. Output Ajd from inverter 34 is supplied to the other input terminal of NOR gate 35. Output Ajf from NOR gate 35 is supplied to column main decoder 21 as an output from filter 20.

FIG. 6(a)–6(c) is a waveform chart of the signals of filter 20 shown in FIG. 5. When output signal Ajp from address predecoder 17 is set at level "H" (time t1), this signal is inverted by inverter 32, and supplied to NOR gate 35 and inverter 33. When delay time $\Delta T$ by inverters 32 to 34 has elapsed after signal Ajp is inverted (time t2), an output from NOR gate 35 is set at level "H". At this time, column main decoder 21 is in a selection state. Therefore, even if power supply noise is superposed on column address signal Aj during period $\Delta T$ between times t1 and t2, this noise is not conducted to column main decoder 21. Therefore, the influence of the power supply noise is eliminated. When output Ajp from address predecoder 17 is set at level "L" (non-selection state) (time t3), signal Ajf is also set at level "L".

Note that although two inverters 33 and 34 are arranged at the other input terminal of NOR gate 35 in the circuit shown in FIG. 5, four or more even-numbered inverters may be arranged so as to obtain a required delay time, as in the circuit shown in FIG. 3.

FIG. 7 shows an arrangement of delay circuit 20 in the circuit shown in FIG. 1. This delay circuit 20 consists of two cascade-connected CMOS inverters 36 and 37. Output signal Ajp from address predecoder 17 is supplied to CMOS inverter 36. Output signal Ajin from inverter 36 is supplied to the input terminal of CMOS inverter 37, and output signal Ajf from inverter 37 is supplied to column main decoder 21. The W/L of p-channel type load MOS transistor 38 constituting CMOS inverter 36 is set larger than that of n-channel type driving MOS transistor 39. Therefore, inverter 36 has characteristics wherein its output signal level rises quickly and falls slowly. On the other hand, the W/L of n-channel type driving MOS transistor 40 constituting CMOS inverter 37 is set larger than that of p-channel type load MOS transistor 41. Therefore, inverter 37 has characteristics wherein its output signal level falls quickly and rises slowly.

FIG. 8(a)–8(c) is a waveform chart of the signals in delay circuit 20 shown in FIG. 7. When an output signal from address predecoder 17 is set at level "H" (time t1), and delay time $\Delta T1$ by inverter 36 has elapsed (time t2), an output from inverter 36 is slowly set at level "L". Then, at time t3 after delay time $\Delta T2$ by inverter 37 has elapsed, an output from inverter 37 is slowly set at level "H". At this time t3, column main decoder 21 is in a selection state. Therefore, even if power supply noise is superposed on column address signal Aj, since the signal level can be controlled by delay circuit 20 so as to slowly change, almost no influence of the power supply noise is conducted to column main decoder 21. When output Ajp from address predecoder 17 is set at level "L" (non-selection state) (time t4), signals Ajin and Ajf are set at level "L" at relatively high speed.

FIG. 9 shows another arrangement of delay circuit 20 in the circuit shown in FIG. 1. This delay circuit 20 consists of two CMOS inverters 42 and 43, and two resistors 44 and 45 respectively arranged at output nodes of the inverters. Output signal Ajp from address predecoder 17 is supplied to CMOS inverter 42. The fall rate of the output level of inverter 42 is reduced by resistor 44. Therefore, inverter 42 has characteristics wherein its output level rises quickly and falls slowly. Output Ajin from inverter 42 is supplied to inverter 43. The rise rate of the output level of inverter 43 is reduced by resistor 45. Therefore, inverter 43 has characteristics wherein its output signal level falls quickly and rises slowly. Output signal Ajf from inverter 45 is supplied to column main decoder 17.

FIG. 10(a)-10(c) is a waveform chart of the signals in delay circuit 20 shown in FIG. 9. As shown in FIG. 10, in the delay circuit having the arrangement shown in FIG. 9, the same delay operation as in the circuit shown in FIG. 7 is performed. Therefore, with this arrangement, the influence of power supply noise is not conducted to column main decoder 21.

Note that delay circuits 20 shown in FIGS. 7 and 9 consist of two inverters, respectively. However, four or more even-numbered cascade-connected inverters may constitute the delay circuit depending upon the required delay time or reduction characteristics of noise.

FIG. 11 shows a semiconductor memory device according to a second embodiment of the present invention. The same reference numerals in FIG. 11 denote the same parts as in the circuit shown in FIG. 1, and the description thereof is omitted. More specifically, in FIG. 11, equalizer 46 is arranged on output lines of sense amplifier 24 in the circuit shown in FIG. 1. Equalizer 46 is controlled in response to equalizing signal $\phi_{EQ2}$ output from clock generator 22. Equalizer 46 equalizes pair of output lines SOa and SOb of sense amplifier 24. Equalizing signal $\phi_{EQ2}$ serves as a pulse-type signal having a change timing delayed with respect to equalizing signal $\phi_{EQ1}$. Equalizing signal $\phi_{EQ1}$ is generated by delaying, e.g., signal $\phi_{EQ2}$.

With the above arrangement, the same operation is basically performed and the same effect can be obtained as in the circuit shown in FIG. 1.

As has been described above, according to the present invention, there is provided a semiconductor memory device which can suppress an operation error due to power supply noise without loss of read access time.

What is claimed is:

1. A semiconductor memory device comprising:
a memory cell array in which memory cells are arranged in a matrix form;
first address input means for receiving a row address signal;
second address input means for receiving a column address signal;
first decoder means for decoding an output signal from said first address input means, to select a row of said memory cell array;
filter means for receiving an output signal from said second address input means and eliminating a level change of the output signal during a predetermined period of time;
second decoder means for decoding an output from said filter means, to select a column of said memory cell array;
sense amplifier means for amplifying readout data from a memory cell selected in response to outputs from said first and second decoder means; and
output means for outputting a signal from said sense amplifier means.

2. A device according to claim 1, wherein said filter means comprises a NAND gate, one input terminal of which receives an output signal from said second address input means, delay means, an input terminal of which receives an output signal from said second address input means, for delaying the received signal and supplying the delayed signal to the other input terminal of said NAND gate, and an inverter for inverting an output from said NAND gate.

3. A device according to claim 2, wherein said delay means comprises even-numbered cascade-connected inverters.

4. A device according to claim 1, wherein said filter means comprises an inverter for receiving an output from said second address input means, a NOR gate, one input terminal of which receives an output signal from said inverter, and delay means, an input terminal of which receives an output signal from said inverter, for delaying the received signal and supplying the delayed signal to the other input terminal of said NOR gate.

5. A device according to claim 4, wherein said delay means comprises even-numbered cascade-connected inverters.

6. A device according to claim 1, wherein said first decoder means comprises a first address predecoder and a row main decoder, and said second decoder means comprises a second address predecoder and a column main decoder, said filter means being arranged between said second address predecoder and said column main decoder.

7. A device according to claim 1, further comprising address transition detector means, connected to output terminals of said first and second address input means, for detecting a change in address signal, and bit line pair equalizer means for operating for a predetermined period of time in response to an output from said address transition detector means, and equalizing bit line pairs of said memory cell array.

8. A device according to claim 7, wherein said address transition detector means comprises first and second address transition detectors, an input terminal of each of which is connected to an output terminal of a corresponding one of said first and second address input means, and a clock generator for receiving outputs from said first and second address transition detectors, and outputting an equalizing signal.

9. A device according to claim 1, further comprising address transition detector means, respectively connected to output terminals of said first and second address input means, for detecting a change in address signal, bit line pair equalizer means for operating for a predetermined period of time in response to a first output from said address transition detector means, and equalizing bit line pairs of said memory cell array, and sense amplifier line pair equalizer means for operating for a predetermined period of time in response to a second output from said address transition detector means, and equalizing a pair of output lines of said sense amplifier means.

10. A device according to claim 9, wherein said address transition detector means comprises first and second address transition detectors, an input terminal of each of which is connected to an output terminal of said address input means, and a clock generator for receiving outputs from said first and second address transition detectors, and outputting first and second equalizing signals.

11. A semiconductor memory device comprising:
a memory cell array in which memory cells are arranged in a matrix form;
first address input means for receiving a row address signal;
second address input means for receiving a column address signal;

first decoder means for decoding an output from said first address input means, to select a row of said memory cell array;

delay means for receiving an output from said second address input means and delaying the output signal;

second decoder means for decoding an output from said delay means, to select a column of said memory cell array;

sense amplifier means for amplifying readout data from a memory cell selected in response to outputs from said first and second decoder means; and output means for outputting a signal from said sense amplifier means.

12. A device according to claim 11, wherein said delay means comprises a first inverter, an input terminal of which receives an output signal from said second address input means, and a second inverter, an input terminal of which receives an output from said first inverter, said first inverter having characteristics wherein the level of the output signal rises quickly and falls slowly, and said second inverter having characteristics wherein the level of the output signal rises slowly and falls quickly.

13. A device according to claim 12, wherein said first inverter comprises a load MOS transistor and a driving MOS transistor, said load MOS transistor having a driving capacity larger than that of said driving MOS transistor, and said second inverter comprises a load MOS transistor and a driving MOS transistor, said driving MOS transistor having a driving capacity larger than that of said load MOS transistor.

14. A device according to claim 12, wherein said first inverter comprises a first load MOS transistor having a current path and a gate, said current path having two opposite ends, one end of said current path connected to a first potential supply source, and said gate connected to the output terminal of said second address input means; a first load element having two opposite ends, one end connected to the other end of the current path of said first load MOS transistor; a first driving MOS transistor having a current path and a gate, said current path having two opposite ends, said current path connected between the other end of said first load element and a second potential supply source, and said gate connected to the output terminal of said second address input means, and wherein said second inverter comprises a second load MOS transistor having a current path and a gate, said current path having two opposite ends, one end of said current path connected to said first potential supply source, and said gate connected to the other end of the current path of said first load MOS transistor; a second load element having two opposite ends, one end connected to the other end of the current path of said second load MOS transistor; and a second driving MOS transistor having a current path and a gate, said current path connected between the other end of said second load element and said second potential supply source, and said gate connected to the other end of the current path of said second load MOS transistor.

15. A device according to claim 11, wherein said first decoder means comprises a first address predecoder and a row main decoder, and said second decoder means comprises a second address predecoder and a column main decoder, said delay means being arranged between said second address predecoder and said column main decoder.

16. A device according to claim 11, further comprising address transition detector means, respectively connected to output terminals of said first and second address input means, for detecting a change in address signal, and bit line pair equalizer means for operating for a predetermined period of time in response to an output from said address transition detector means, and equalizing bit line pairs of said memory cell array.

17. A device according to claim 16, wherein said address transition detector means comprises first and second address transition detectors, an input terminal of each of which is connected to an output terminal of said address input means, and a clock generator for receiving outputs from said first and second address transition detectors, and outputting an equalizing signal.

18. A device according to claim 11, further comprising address transition detector means, respectively connected to output terminals of said first and second address input means, for detecting a change in address signal, bit line pair equalizer means for operating for a predetermined period of time in response to a first output from said address transition detector means, and equalizing bit line pairs of said memory cell array, and sense amplifier line pair equalizer means for operating for a predetermined period of time in response to a second output from said address transition detector means, and equalizing a pair of output lines of said sense amplifier means.

19. A device according to claim 18, wherein said address transition detector means comprises first and second address transition detectors, input terminals of which are respectively connected to output terminals of said first and second address input means, and a clock generator for receiving outputs from said first and second address transition detectors, and outputting first and second equalizing signals.

* * * * *